(12) United States Patent
Luo et al.

(10) Patent No.: US 10,523,195 B1
(45) Date of Patent: Dec. 31, 2019

(54) MIXED STYLE BIAS NETWORK FOR RF SWITCH FET STACKS

(71) Applicant: pSemi Corporation, San Diego, CA (US)

(72) Inventors: Yuan Luo, San Diego, CA (US); Matt Allison, Oceanside, CA (US); Eric S. Shapiro, San Diego, CA (US)

(73) Assignee: pSemi Corporation, San Diego, CA (US)

(*) Notice: Subject to any disclaimer, the term of this patent is extended or adjusted under 35 U.S.C. 154(b) by 0 days.

(21) Appl. No.: 16/053,710

(22) Filed: Aug. 2, 2018

(51) Int. Cl.
*H03K 17/16* (2006.01)
(52) U.S. Cl.
CPC .................................. *H03K 17/162* (2013.01)
(58) Field of Classification Search
CPC .................................. H03K 7/16; H03K 7/162
See application file for complete search history.

(56) References Cited

U.S. PATENT DOCUMENTS

| | | | |
|---|---|---|---|
| 6,137,367 A | 10/2000 | Ezzedine et al. | |
| 6,407,614 B1 * | 6/2002 | Takahashi | H03K 17/162 327/407 |
| 7,098,755 B2 | 8/2006 | Zhao et al. | |
| 7,459,988 B1 | 12/2008 | Iversen | |
| 7,492,209 B2 | 2/2009 | Prikhodko et al. | |
| 7,492,238 B2 | 2/2009 | Nakatsuka et al. | |
| 7,535,320 B2 | 5/2009 | Buer et al. | |
| 7,910,993 B2 | 3/2011 | Brindle et al. | |
| 8,330,519 B2 | 12/2012 | Lam et al. | |
| 8,461,903 B1 | 6/2013 | Granger-Jones | |
| 8,481,372 B2 | 7/2013 | Mouli | |
| 8,487,706 B2 | 7/2013 | Li et al. | |
| 8,669,804 B2 | 3/2014 | Ranta et al. | |

(Continued)

FOREIGN PATENT DOCUMENTS

WO 2019191140 10/2019

OTHER PUBLICATIONS

Tra, Anh Quan, Office Action received from the USPTO dated May 8, 2019 for U.S. Appl. No. 15/939,132, 143 pgs.

(Continued)

*Primary Examiner* — Hai L Nguyen
(74) *Attorney, Agent, or Firm* — Jaquez Land Greenhaus LLP; John Land, Esq.

(57) ABSTRACT

Embodiments include a switch stack comprising ACS FETs and mixed-style gate resistor bias networks that mitigate the effects of high leakage current. By carefully selecting the number of ACS FETs in a sub-stack that uses a rung gate resistor bias network versus a sub-stack that uses a rail gate resistor bias network, as well as by selecting particularly useful values for the gate resistors in each bias network, a tradeoff can be achieved between adverse Vg offset and Q factor. The switch stack may be configured with rung-rail gate resistor bias networks, or with rung-rail-rung gate resistor bias networks. Other embodiments include mixed-style body resistor bias networks in switch stacks comprising non-ACS FETs. Some embodiments include one or more positive-logic FETs M1-Mn, series-coupled on at least one end to an "end-cap" FET $M_0$ of a type that turns OFF when the applied $V_{GS}$ is essentially zero volts.

16 Claims, 10 Drawing Sheets

(56) References Cited

U.S. PATENT DOCUMENTS

| | | |
|---|---|---|
| 9,438,223 B2 | 9/2016 | de Jongh |
| 9,948,281 B2 | 4/2018 | Ranta |
| 10,236,872 B1 | 3/2019 | Willard et al. |
| 10,320,379 B2 * | 6/2019 | Kerr ............... H03K 17/161 |
| 2005/0179506 A1 | 8/2005 | Takahashi et al. |
| 2010/0308932 A1 | 12/2010 | Rangarajan et al. |
| 2011/0127849 A1 | 6/2011 | Yoon et al. |
| 2011/0260774 A1 | 10/2011 | Granger-Jones et al. |
| 2013/0015717 A1 | 1/2013 | Dykstra |
| 2014/0009214 A1 | 1/2014 | Altunkilic et al. |
| 2014/0055191 A1 | 2/2014 | Kim et al. |
| 2014/0118053 A1 | 5/2014 | Matsuno |
| 2015/0270806 A1 | 9/2015 | Wagh et al. |
| 2015/0364928 A1 | 12/2015 | Yen et al. |
| 2015/0381171 A1 | 12/2015 | Cebi et al. |
| 2017/0201248 A1 | 7/2017 | Scott et al. |
| 2017/0272066 A1 | 9/2017 | Scott et al. |
| 2017/0338321 A1 | 11/2017 | Hurwitz et al. |
| 2018/0069530 A1 | 3/2018 | Ranta et al. |
| 2018/0114801 A1 | 4/2018 | Leipold et al. |
| 2018/0175851 A1 | 6/2018 | Kerr et al. |
| 2019/0305767 A1 | 10/2019 | Ranta et al. |
| 2019/0305768 A1 | 10/2019 | Willard et al. |
| 2019/0305769 A1 | 10/2019 | Willard et al. |

OTHER PUBLICATIONS

Gundlach, Susanne, Invitation to Pay Additional Fees and, Where Applicable, Protest Fee received from the EPO dated Jul. 5, 2019 for appln. No. PCT/US2019/024143, 13 pgs.

Wells, Kenneth B., Notice of Allowance received from the USPTO dated Jul. 17, 2019 for U.S. Appl. No. 15/939,128, 19 pgs.

Chen, Patrick C., Office Action received from the USPTO dated Apr. 4, 2017 for U.S. Appl. No. 15/256,453, 6 pgs.

Chen, Patrick C., Office Action received from the USPTO dated May 25, 2017 for U.S. Appl. No. 15/256,453, 11 pgs.

Chen, Patrick C., Notice of Allowance received from the USPTO dated Dec. 15, 2017 for U.S. Appl. No. 15/256,453, 189 pgs.

Wells, Kenneth, Office Action received from the USPTO dated Oct. 29, 2018 for U.S. Appl. No. 15/939,128, 210 pgs.

Wells, Kenneth, Office Action received from the USPTO dated Dec. 12, 2018 for U.S. Appl. No. 15/939,128, 18 pgs.

Ranta, et al., "Positive Logic Switch with Selectable DC Blocking Circuit", patent application filed in the USPTO Mar. 28, 2018 for U.S. Appl. No. 15/939,128, 62 pgs.

Ranta, et al., Preliminary Amendment filed in the USPTO dated Jun. 26, 2018 for U.S. Appl. No. 15/939,128, 5 pgs.

Ranta, et al., Response filed in the USPTO dated Nov. 9, 2018 for U.S. Appl. No. 15/939,128, 13 pgs.

Ranta, et al., Response filed in the USPTO dated Jan. 24, 2019 for U.S. Appl. No. 15/939,128, 10 pgs.

Willard, et al. "Stacked FET Switch Bias Ladders" patent application filed in the USPTO Mar. 28, 2018 for U.S. Appl. No. 15/939,132, 62 pgs.

Willard, et al., Preliminary Amendment filed in the USPTO dated Jun. 20, 2018 for U.S. Appl. No. 15/939,132, 5 pgs.

Wells, Kenneth B., Office Action received from the USPTO dated Nov. 2, 2018 for U.S. Appl. No. 15/939,144, 11 pgs.

Wells, Kenneth B., Notice of Allowance received from the USPTO dated Jan. 14, 2019 for U.S. Appl. No. 15/939,144, 205 pgs.

Willard, et al., Response filed in the USPTO dated Dec. 13, 2018 for U.S. Appl. No. 15/939,144, 10 pgs.

Willard, et al., Preliminary Amendment filed in the USPTO dated Jun. 20, 2018 for U.S. Appl. No. 15/939,144, 4 pgs.

Tra, Anh Quan, Notice of Allowance received from the USPTO dated Aug. 13, 2019 for U.S. Appl. No. 15/939,132, 18 pgs.

Wells, Kenneth B., Notice of Allowance received from the USPTO dated Oct. 17, 2019 for U.S. Appl. No. 15/939,128, 10 pgs.

\* cited by examiner

Providing a first sub-stack including two or more series-connected ACS FETs, each ACS FET having a gate terminal, and a rung gate resistor bias network comprising parallel gate resistors each coupled to a first control voltage and to the gate terminal of a corresponding one of the ACS FETs of the first sub-stack — 802

Connecting a second sub-stack in series with the first sub-stack, the second sub-stack including two or more series-connected ACS FETs, each ACS FET having a gate terminal, and a rail gate resistor bias network comprising series gate resistors each coupled, directly or indirectly, to a second control voltage and to the respective gate terminals of at least two of the ACS FETs of the second sub-stack — 804

FIG. 11

MIXED STYLE BIAS NETWORK FOR RF SWITCH FET STACKS

CROSS-REFERENCE TO RELATED APPLICATIONS

The present application may be related to the following patents and patent applications, the contents of all of which are incorporated herein by reference:
Co-pending U.S. patent application Ser. No. 15/256,453, filed Sep. 2, 2016, entitled "Positive Logic Digitally Tunable Capacitor";
U.S. Pat. No. 7,910,993, issued Mar. 22, 2011, entitled "Method and Apparatus for use in Improving Linearity of MOSFETs Using an Accumulated Charge Sink";
Co-pending U.S. patent application Ser. No. 15/939,128, filed Mar. 28, 2018, entitled "Positive Logic Switch with Selectable DC Blocking Circuit";
Co-pending U.S. patent application Ser. No. 15/939,132, filed Mar. 28, 2018, entitled "Stacked FET Switch Bias Ladders"; and
Co-pending U.S. patent application Ser. No. 15/939,144, filed Mar. 28, 2018, entitled "AC Coupling Modules for Bias Ladders".

BACKGROUND (1) Technical Field

The invention relates to electronic circuits, and more particularly to radio frequency electronic switch circuits and related methods.

(2) Background

Figure 1:
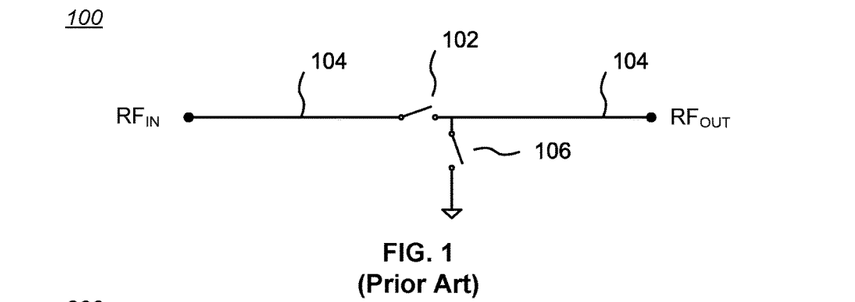
FIG. 1 is a simplified schematic circuit of a common prior art series-shunt switch circuit configuration.

In radio frequency (RF) systems, such as cellular phones and WiFi networks, electronic switch circuits are often used in series with RF signal lines to selectively block or conduct RF signals, such as between an antenna and a transceiver circuit. Electronic switch circuits are also often used in a shunt configuration between an RF signal line and a reference potential (e.g., circuit ground), for example, to selectively isolate nodes of the RF signal line from significantly influencing other circuitry. As one example, FIG. 1 is a simplified schematic circuit of a common prior art series-shunt switch circuit configuration 100. In the illustrated configuration, a series switch circuit 102 is coupled in series with an RF signal line 104 between an $RF_{IN}$ port and an $RF_{OUT}$ port, and a shunt switch circuit 106 is coupled to the RF signal line 104 between the $RF_{OUT}$ port and circuit ground. As illustrated, the series switch circuit 102 and shunt switch circuit 106 are modeled as single-pole, single-throw (SPST) switches. In use, the series switch circuit 102 and shunt switch circuit 106 are generally operated in a complementary manner: if series switch circuit 102 is open, then shunt switch circuit 106 is closed, and if series switch circuit 102 is closed, then shunt switch circuit 106 is open.

Ideally, switch circuits such as those shown in FIG. 1 should not appreciably alter or affect an RF signal. However, in integrated circuits (ICs), RF switching circuits are generally implemented with transistors, particularly field-effect transistors (FETs), and more particularly MOSFETs. As is known, a FET includes a source terminal, a drain terminal, a gate terminal, and a body. A FET in a conducting (ON) state presents some resistance, RON, to a conducted signal, and in a blocking (OFF) state presents some capacitance, $C_{OFF}$, which may be in series, shunt, or parallel to an RF signal line. Furthermore, the solid-state nature of an IC causes undesirable interactions between regions of the IC, leading to such phenomena as leakage currents, parasitic capacitances, inductances, and resistances. Accordingly, FET-based switch circuits generally behave less than ideally in an RF circuit.

A further issue with FETs is that the voltage that a single FET can withstand between drain and source without breaking down is generally limited to a few volts. In an electronic system, there may be parts of the system where the voltage that must be withstood far exceeds the voltage handling capability of a single FET. A common solution is to series stack FETs so that the drain-source voltage across any one FET is less than its drain-source breakdown voltage (Vbd).

Figure 2:
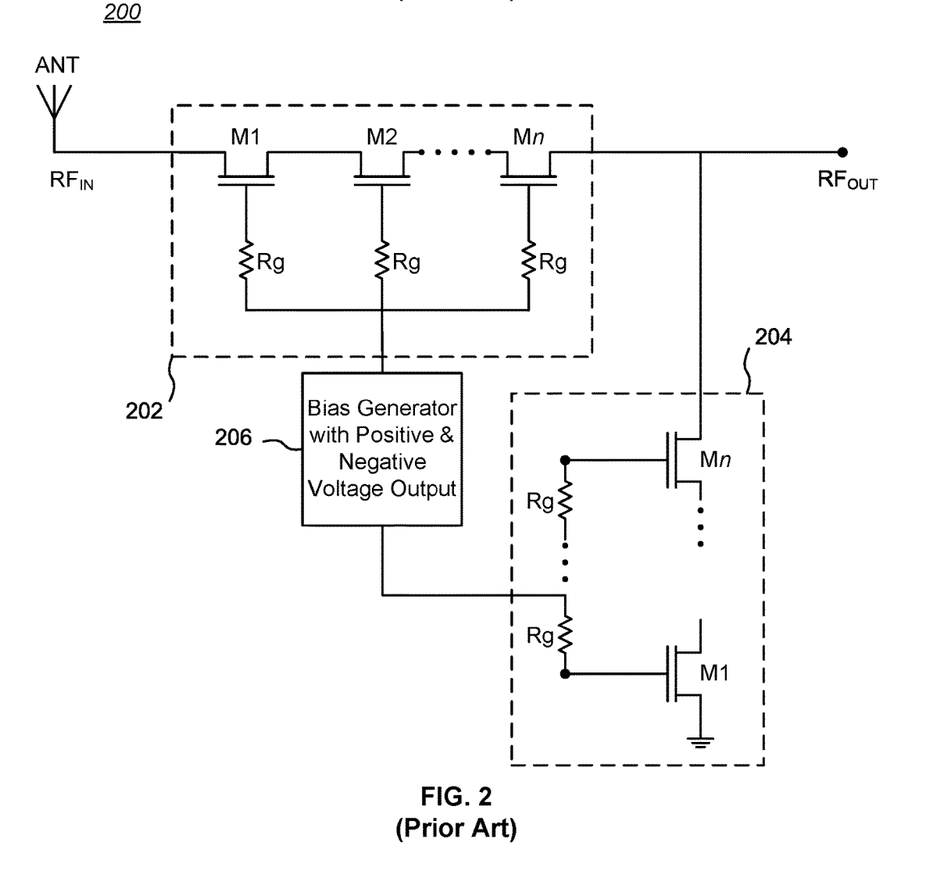
FIG. 2 is a schematic circuit of a prior art series-shunt RF switch circuit using FET stacks.

For example, FIG. 2 is a schematic circuit of a prior art series-shunt RF switch circuit 200 using FET stacks. In this example, an RF signal from an antenna ANT is coupled from $RF_{IN}$ through a series stack 202 to $RF_{OUT}$. A shunt stack 204 is coupled between $RF_{OUT}$ and circuit ground. Each of the stacks 202, 204 comprises a plurality of series-coupled FETs M1-Mn (although "n" may differ for the two stacks 202, 204). In this example, each FET includes a gate resistor Rg coupled to a bias generator 206. Using the analogy of a ladder, where its vertical members are referred to as "rails" and its horizontal cross members as "rungs", the gate resistors Rg for the series stack 202 are shown to be in a parallel "rung" bias network configuration, and the gate resistors Rg for the shunt stack 204 are shown to be in a series "rail" bias network configuration, but either bias network configuration may be used with either type of stack. For the series "rail" configuration, the gate resistors Rg for the shunt stack may be coupled to a control voltage, Vctrl, either directly or, alternatively, indirectly through other series-connected gate resistors in the "rail" network structure. Further examples of both "rung" and "rail" configurations are depicted in co-pending U.S. patent application Ser. No. 15/939,132, referenced above.

In most applications using an integrated circuit (IC) implementation of the circuit shown in FIG. 2, a positive supply voltage is readily available from an external source and may be coupled to the resistors Rg through the bias generator 206. A negative supply voltage is usually generated on-chip within the bias generator 206, for example, by using one or more negative voltage charge pumps and voltage regulators that convert the externally supplied positive supply voltage to a negative voltage.

A standard biasing scheme is usually used in this type of circuit 200 when configured with FET switches having a common threshold voltage and channel structure. A positive voltage is applied to the gate of each FET M1-Mn of a stack 202, 204 to turn the stack ON (conducting), and a negative voltage is applied to the gate of each FET M1-Mn of a stack 202, 204 to turn the stack OFF (blocking). By way of example, a positive DC voltage of +3 volts may be applied (through the resistors Rg) to the gates of each FET M1-Mn of a stack 202, 204 to turn the stack ON, and a negative DC voltage of −3 volts may be applied (again, through the resistors Rg) to the gates of each M1-Mn of a stack 202, 204 to turn the stack OFF. For good performance, it is desirable to use a large enough negative voltage to fully turn each FET switch M1-Mn OFF. Turning the FET switches into a full OFF state results in improved RF linearity in terms of harmonics and inter-modulation distortion (IMD), better RF power handling, higher isolation, and lower leakage current, among other advantages.

In many RF applications, it is advantageous to fabricate FETs using silicon-on-insulator (SOI)—including siliconon-sapphire (SOS)—technology, to achieve a number of important performance parameters. The linearity of an SOI FET can be improved by providing a means for sweeping out accumulated charge trapped below the gate oxide of the FET, such as by use of the "HaRP"™ accumulated charge sink (ACS) technology taught in U.S. Pat. No. 7,910,993, referenced above. An "accumulated charge", as defined in more detail in U.S. Pat. No. 7,910,993 and as used herein, refers to gate-bias induced carriers that may accumulate in the body of an OFF-state MOSFET, even if the majority carriers in the body do not have the same polarity as the accumulated charge. More particularly, as described in greater detail in U.S. Pat. No. 7,910,993, no matter what mode of operation an SOI FET employs (i.e., whether enhancement or depletion mode), when the FET is operated in an OFF-state (i.e., the gate voltage does not exceed $V_{th}$), and when a sufficient nonzero gate bias voltage is applied with respect to the FET source and drain, an "accumulated charge" may occur under the FET gate which adversely affects the linearity and other aspects of the performance of the FET. To alleviate the effects of such accumulated charge, an SOI FET may include an ACS structure that allows discharge of accumulated charge when the FET is in a non-conducting (OFF) mode while allowing normal operation when the FET is in a conducting (ON) mode.

Figure 3:
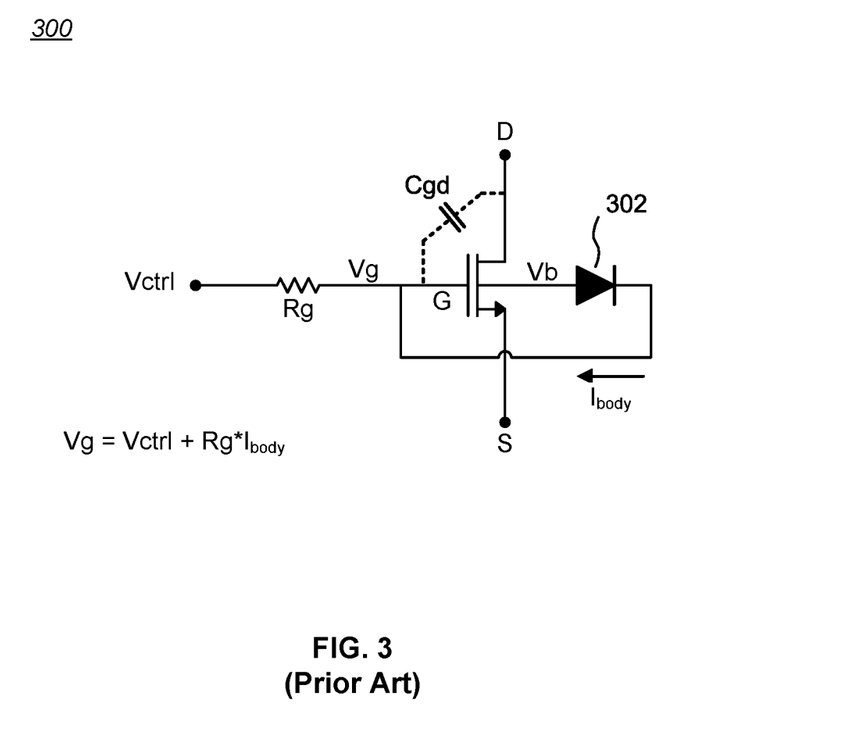
FIG. 3 is a simplified schematic diagram of an SOI FET that includes an ACS structure.

FIG. 3 is a simplified schematic diagram of an SOI FET 300 that includes an ACS structure. The FET 300 includes conventional drain D, source S, and gate G terminals, and a gate resistor Rg coupled to a control voltage Vctrl. One of the several parasitic capacitances is shown—the gate-to-drain parasitic capacitance, Cgd. In this particular example, an ACS structure comprising a diode 302 is coupled from the body of the FET 300 to the gate G of the FET 300. The diode 302 discharges accumulated charge from the body of the FET 300 through the gate G when the FET 300 is in a non-conducting (OFF) mode, while allowing normal operation when the FET 300 is in a conducting (ON) mode. Alternative ACS structure circuits and methods for reducing accumulated charge in floating body semiconductor devices are described in greater detail in U.S. Pat. No. 7,910,993 referenced above. The FET 300 along with an ACS structure (e.g., a body-togate diode 302) may also be referred to as an "ACS FET". As should be clear, in an SOI FET stack comprising one or more series-coupled FETs M1-Mn, one or more of the FETs may be ACS FETs.

One drawback of some ACS FETs is that they have a high leakage current, $I_{body}$, conducted from the body of the ACS FET through the diode 302 to the gate G, as indicated in FIG. 3. The $I_{body}$ leakage current causes the actual gate control voltage, $Vg=Vctrl+Rg*I_{body}$, to drop, which degrades the breakdown voltage Vbd of the ACS FET (and thus of every ACS FET in a switch comprising a stack of such ACS FETs). Note that Vg and Vctrl are generally both negative values, and that the resultant Vg value is less negative than Vctrl due to the addition of the $Rg*I_{body}$ effect. Thus, when the ACS FET is in an OFF state, the $I_{body}$ leakage current causes the actual gate control voltage to be less negative, which degrades the breakdown voltage Vbd of the ACS FET (and thus of every ACS FET in a switch comprising a stack of such ACS FETs). Further, the total $I_{body}$ leakage current is additive and becomes significant, which adversely affects the harmonic performance of the switch stack.

Accordingly, there is a need for an improved switch stack comprising ACS FETs that mitigates the effects of high leakage current. The present invention addresses this and other needs.

SUMMARY

The invention encompasses an improved switch stack comprising ACS FETs and novel mixed-style gate resistor bias networks that mitigate the effects of high leakage current. By carefully selecting the number of ACS FETs in a sub-stack that uses a rung gate resistor bias network versus a sub-stack that uses a rail gate resistor bias network, as well as by selecting particularly useful values for the gate resistors in each bias network, a tradeoff can be achieved between adverse Vg offset and Q factor. The switch stack may be configured with rung-rail gate resistor bias networks (particularly useful as a shunt switch), or with rung-rail-rung gate resistor bias networks (particularly useful as a series switch).

The invention further encompasses use of novel mixed-style body resistor bias networks in switch stacks comprising non-ACS FETs.

Some embodiments may include one or more series-coupled positive-logic FETs M1-Mn, series-coupled on at least one end to an "end-cap" FET $M_0$. The positive-logic FETs M1-Mn are of a type that require a negative $V_{GS}$ to turn OFF, but configured so as to not require a negative power supply. The $M_0$ end-cap FETs are of a type that turn OFF when the applied $V_{GS}$ is essentially zero volts. The end-cap $M_0$ FETs selectably provide either a capacitive DC blocking function or a resistive signal path.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The invention encompasses an improved switch stack comprising ACS FETs and novel mixed-style gate resistor bias networks that mitigate the effects of high leakage current. The invention further encompasses use of novel mixed-style body resistor bias networks in switch stacks comprising non-ACS FETs.

Again using the analogy of a ladder, referring to vertical members as "rails" and horizontal cross members as "rungs", consider a conventional switch stack comprising ACS FETs and having a parallel "rung" gate resistor bias network configuration for the gate resistors Rg (e.g., as shown in FIG. 2 for series stack 202). The increase of Vg relative to Vctrl for individual ACS FETs due to leakage current, $I_{body}$, can be minimized by reducing the value Rg, since Vg=Vctrl+Rg*$I_{body}$ (noting that Vg and Vctrl are generally negative); the increase of Vg relative to Vctrl is referred to as an "adverse Vg offset". However, reducing Rg in a rung gate resistor bias network also reduces the quality (Q) factor of the switch stack, since a low value for Rg allows more RF signal to leak from the drain D to the Vctrl control terminal through the gate resistor Rg and parasitic capacitance Cgd, as shown in FIG. 3.

Conversely, in a conventional switch stack comprising ACS FETs and having a series "rail" gate resistor bias network configuration for the gate resistors Rg (e.g., as shown in FIG. 2 for shunt stack 204), the adverse Vg offset for individual ACS FETs is a function not only of $I_{body}$ for every ACS FET, but also of the entire Rg bias network. The adverse Vg offset worsens significantly as the number of ACS FETs in the switch stack increases (i.e., as the "stack height" increases). This makes a rail gate resistor bias network configuration unsuitable for switches with a significant stack height (e.g., greater than about 20 ACS FETs).

It was realized by the inventors that the drawbacks of conventional rung-only or rail-only gate resistor bias networks can be overcome by combining these two types of gate resistor bias networks in one ACS FET switch design. By carefully selecting the number of ACS FETs in a sub-stack that uses a rung gate resistor bias network versus a sub-stack that uses a rail gate resistor bias network, as well as by selecting particularly useful values for the gate resistors in each bias network, a tradeoff can be achieved between adverse Vg offset and Q factor.

Figure 4:
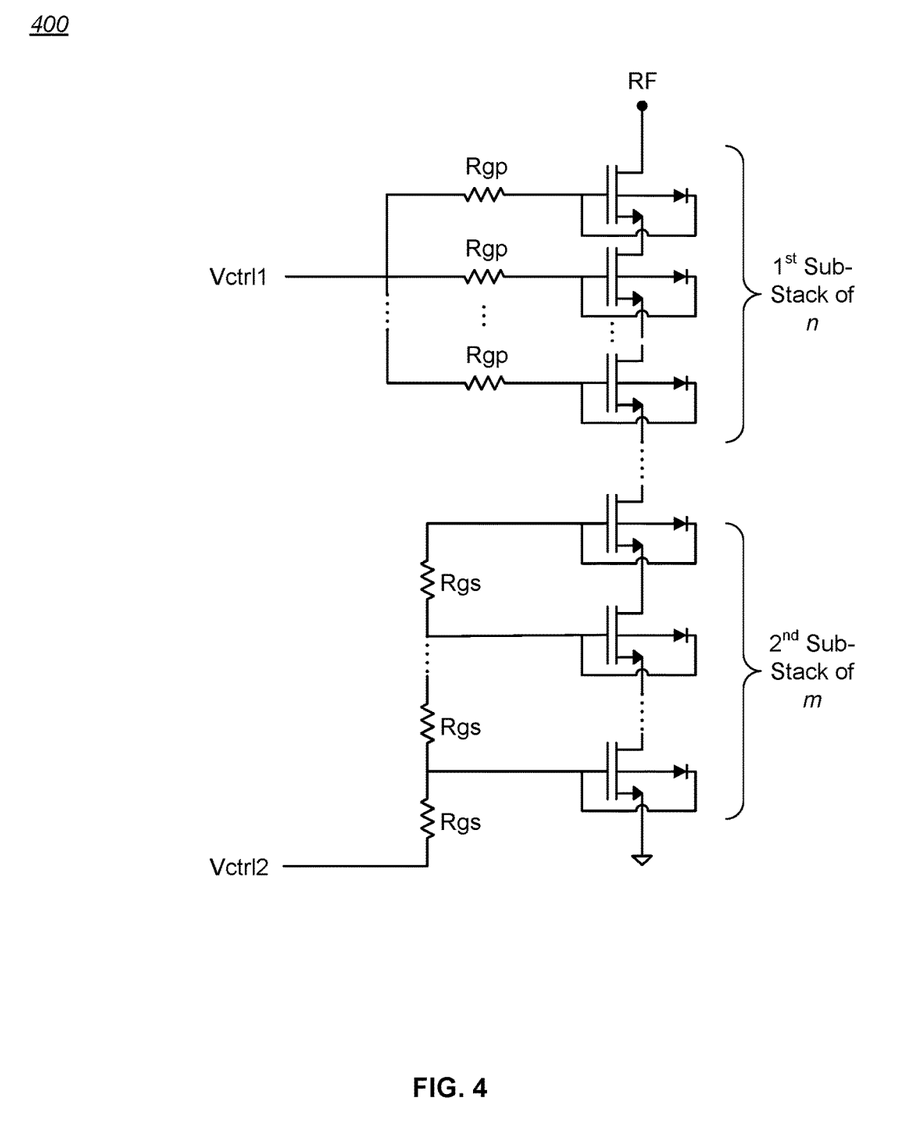
FIG. 4 is a schematic diagram of an ACS FET shunt switch stack which includes two series-coupled sub-stacks and mixed-style gate resistor bias networks.

For example, FIG. 4 is a schematic diagram of an ACS FET shunt switch stack 400 which includes two series-coupled sub-stacks and mixed-style gate resistor bias networks. In the illustrated example, a first sub-stack of n series-connected ACS FETs is configured with a rung gate resistor bias network configuration comprising parallel gate resistors Rgp each coupled to a first control voltage Vctrl1 and to the gate terminal of a corresponding one of the n ACS FETs. A second sub-stack of m series-connected ACS FETs is configured with a rail gate resistor bias network configuration comprising series gate resistors Rgs each coupled (directly or indirectly) to a second control voltage Vctrl2 (which may be the same as Vctrl) and to the respective gate terminals of at least two of the m ACS FETs (generally, such FETs would be adjacent). Both n and m are integers, with n being at least one and m being greater than one, and may or may not be equal to each other. The stack height of the ACS FET switch stack 400 is equal to n+m. In general, when ordered as shown in FIG. 4, any RF voltage input should be applied initially to the sub-stack of ACS FETs configured with a rung gate resistor bias network configuration. However, more generally, the FETs of the first and second sub-stacks may be placed in any physical ordering (e.g., interdigitated), so long as at least one parallel gate resistor and/or at least one series gate resistor separates the gate terminal of each FET from the gate terminal of any other FET.

Note that the values of all of the parallel gate resistors Rgp are generally the same, but may differ from each other, and may also differ from the values of the series gate resistors Rgs. Further, while the values of the series gate resistors Rgs may be the same, those values may vary within the second sub-stack of m ACS FETs. For example, the values of the series gate resistors Rgs may be "tapered" from "top" (i.e., nearest the RF terminal in FIG. 4) to "bottom" (i.e., nearest the ground terminal in FIG. 4) of the second sub-stack of the ACS FET switch stack 400, such that the Rgs values nearest the RF terminal of the switch stack 400 are greater than the Rgs values at or near the bottom of the switch stack 400. Tapering the Rgs values for the series gate resistors Rgs of the second sub-stack reduces the offset between Vctrl2 and the Vg of the constituent ACS FETs.

As noted above, a rung gate resistor bias network results in a relatively low Q factor but has a lesser adverse Vg offset at each ACS FET, while a rail gate resistor bias network results in a higher Q factor but has a greater adverse Vg offset. Mixed-style gate resistor bias networks combine a rung gate resistor bias network and a rail gate resistor bias network to enable selectively trading off between Q factor and gate voltage (Vg) drop due to $I_{body}$ leakage. Accordingly, mixed-style gate resistor bias networks provide a significant degree of freedom in switch stack design.

As one example of the benefits of mixed-style gate resistor bias networks for an ACS FET switch, TABLE 1 sets forth a comparison of ACS FET switches using, respectively, a rung-only gate resistor bias network, a rail-only gate resistor bias network, and mixed-style gate resistor bias networks. This particular example is a simulation of ACS FET switches having a stack height of 26 for all three examples. For the ACS FET switch model using mixed-style gate resistor bias networks, the 10 ACS FETs (i.e., $1^{st}$ sub-stack of n=10) nearest the source of RF voltage input were configured with a parallel rung gate resistor bias network, while the remaining 16 ACS FETs (i.e., $2^{nd}$ sub-stack of m=16) were configured with a series rail gate resistor bias network.

TABLE 1

| Rg Bias Network Style | Rg* $I_{body}$ Drop (v) | Q Factor @ 1 GHz |
| --- | --- | --- |
| Rung only | 0.29 | 13.4 |
| Rail only | 1.14 | 22.4 |
| Mixed Rung-Rail | 0.37 | 14.8 |

As TABLE 1 shows, the mixed rung-rail style gate resistor bias networks have an Rg*$I_{body}$ voltage, 0.37V, that is relatively close to a rung-only gate resistor bias network (0.29V), and much less than a rail-only gate resistor bias network (1.14V). Since Vg=Vctrl+Rg*$I_{body}$, keeping the Rg*$I_{body}$ factor low results in a lower actual gate control voltage Vg (again noting that Vg and Vctrl are generally negative). Further, the mixed rung-rail style gate resistor bias networks have a Q factor that is greater than a rung-only gate resistor bias network, a result that holds true in the simulations for a wide range of frequencies (e.g., $10^8$ to $10^{10}$ Hz).

Figure 5:
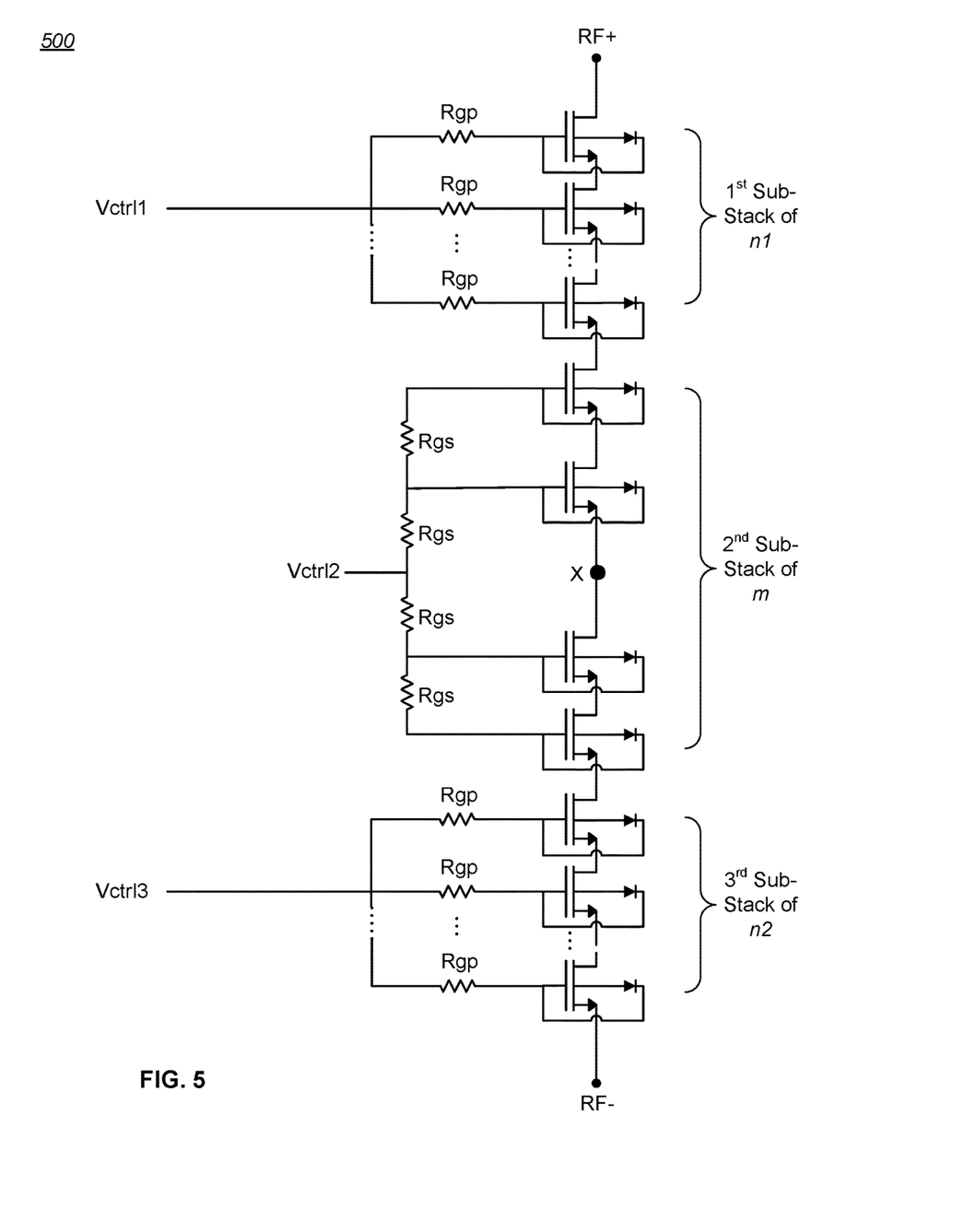
FIG. 5 is a schematic diagram of an ACS FET series switch stack which includes mixed-style gate resistor bias networks.

The ACS FET switch stack 400 of FIG. 4 is configured primarily for use as a shunt switch. For a series switch, in which an RF voltage signal may be applied to either end, it may be useful to utilize mixed-style gate resistor bias networks in a "rung-rail-rung" configuration. For example, FIG. 5 is a schematic diagram of an ACS FET series switch stack 500 which includes mixed-style gate resistor bias networks. In the illustrated example, the ACS FET switch stack 500 includes three series-coupled sub-stacks. A first sub-stack of n1 series-connected ACS FETs is configured with a rung gate resistor bias network configuration comprising parallel gate resistors Rgp each coupled to a first control voltage Vctrl1 and to the gate terminal of a corresponding one of the n1 ACS FETs. A second sub-stack of m series-connected ACS FETs is configured with a rail gate resistor bias network configuration comprising series gate resistors Rgs each coupled (directly or indirectly) to a second control voltage Vctrl2 (which may be the same as Vctrl) and to the respective gate terminals of at least two of the m ACS FETs (in generally, such FETs would be adjacent). A third sub-stack of n2 series-connected ACS FETs is configured with a rung gate resistor bias network configuration comprising parallel gate resistors Rgp each coupled to a third control voltage Vctrl3 (which may be the same as Vctrl1 and/or Vctrl2) and to the gate terminal of a corresponding one of the n2 ACS FETs. The numbers n1, n2, and m are integers, with n1 and n2 being at least one and m being greater than one, and may or may not be equal to each other (note that the stack heights n1 and n2 of the first and third sub-stacks should generally be the same, for symmetry, but in some applications, the respective values of n1 and n2 for those sub-stacks may differ). The stack height of the ACS FET switch stack 500 is equal to n1+m+n2.

Note that the values of all of the parallel gate resistors Rgp in a single sub-stack are generally the same, but may differ from each other, and may also differ from the values of the gate resistors Rgp of the other parallel gate resistor sub-stack and from the values of the series gate resistors Rgs. Further, while the values of the series gate resistors Rgs may be the same, those values may vary within the second sub-stack of m ACS FETs. For example, the values of the series gate resistors Rgs may be "tapered" from both "top" and "bottom" (i.e., nearest the RF+ and the RF− terminals in FIG. 5) of the ACS FET switch stack 500 to near the middle of the ACS FET switch stack 500 (e.g., at node "X"), such that the Rgs values at or near the RF inputs to the second sub-stack are greater than the Rgs values at or near the middle of the second sub-stack. Again, tapering the Rgs values for the series gate resistors Rgs of a sub-stack reduces the offset between the corresponding Vctrlx and the Vg of the ACS FETs of the sub-stack.

For either a shunt or a series switch configuration, the values of Rgs and Rgp for a particular application will depend on (among other factors) stack height and $I_{body}$ leakage current of the particular ACS FETs selected for the application. Specific Rgs and Rgp values may be determined, for example, by iterative simulations, in known fashion.

Note that the physical placement on an IC of the ACS FETs of the sub-stacks shown in FIG. 4 or FIG. 5 may be other than as schematically depicted. For example, referring to FIG. 4, the ACS FETs of stack m may be physically interdigitated individually or in groups among the ACS FETs of stack n and the separate bias networks routed appropriately. More generally, any physical partitioning or grouping of ACS FETs in sub-stacks is encompassed by the invention. One key to reasonable voltage division in a FET stack is to assure each FET gate has at least one resistor (Rgp or Rgs) between it and adjacent FET gates. Thus, the invention encompasses any combination of FET ordering as long as at least one rung and/or rail resistor separates each gate from any other gate in the stack and/or sub-stack configuration.

Figure 6:
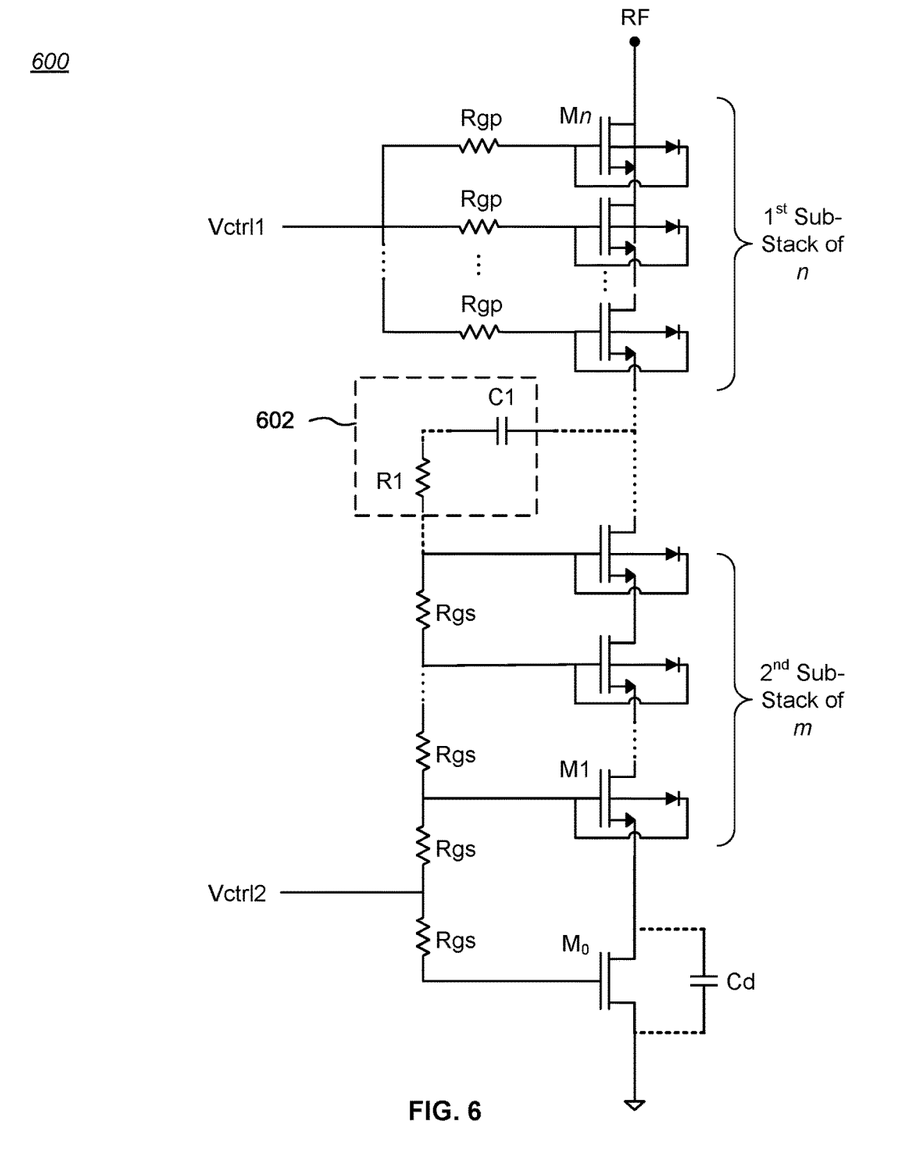
FIG. 6 is a schematic diagram of an ACS FET switch stack that includes one or more series-coupled positive-logic FETs M1-Mn, series-coupled on at least one end to an "end-cap" FET $M_0$.

The examples given in the description above have used switch stacks comprising FETs of the same type. However, the invention encompasses other types of switch stacks. For example, FIG. 6 is a schematic diagram of an ACS FET switch stack 600 that includes one or more series-coupled positive-logic ACS FETs M1-Mn, series-coupled on at least one end to an "end-cap" FET $M_0$. The positive-logic FETs M1-Mn are zero-Vt, low-Vt, or high-Vt FETs of a type that require a negative $V_{GS}$ to turn OFF, but configured so as to not require a negative power supply. The $M_0$ end-cap FETs (only one is shown in FIG. 6) are of a high-Vt type that turn OFF when the applied $V_{GS}$ is essentially zero volts. The end-cap $M_0$ FETs selectably provide either a capacitive DC blocking function or a resistive signal path. Some switch embodiments may comprise a stack of only $M_0$ FETs, or a mix of positive-logic FETs and $M_0$ FETs, so long as at least one end-cap FET is an $M_0$ FET. An end-cap capacitor may be included to prevent early breakdown of a corresponding end-cap $M_0$ FET. More particularly, in the embodiment shown in FIG. 6, the drain and source of the illustrated end-cap $M_0$ FET is coupled in parallel with a capacitor Cd. Since the end-cap $M_0$ FET is biased with Vgs=0V and thus usually cannot handle the full drain-source voltage Vds applied across it, the Vds across the end-cap $M_0$ FET is lowered (e.g., to 2V) by its respective capacitor Cd. Further details of switch stacks that utilize one or more $M_0$ end-cap FETs are set forth in co-pending U.S. patent application Ser. No. 15/939,128, referenced above.

Figure 7:
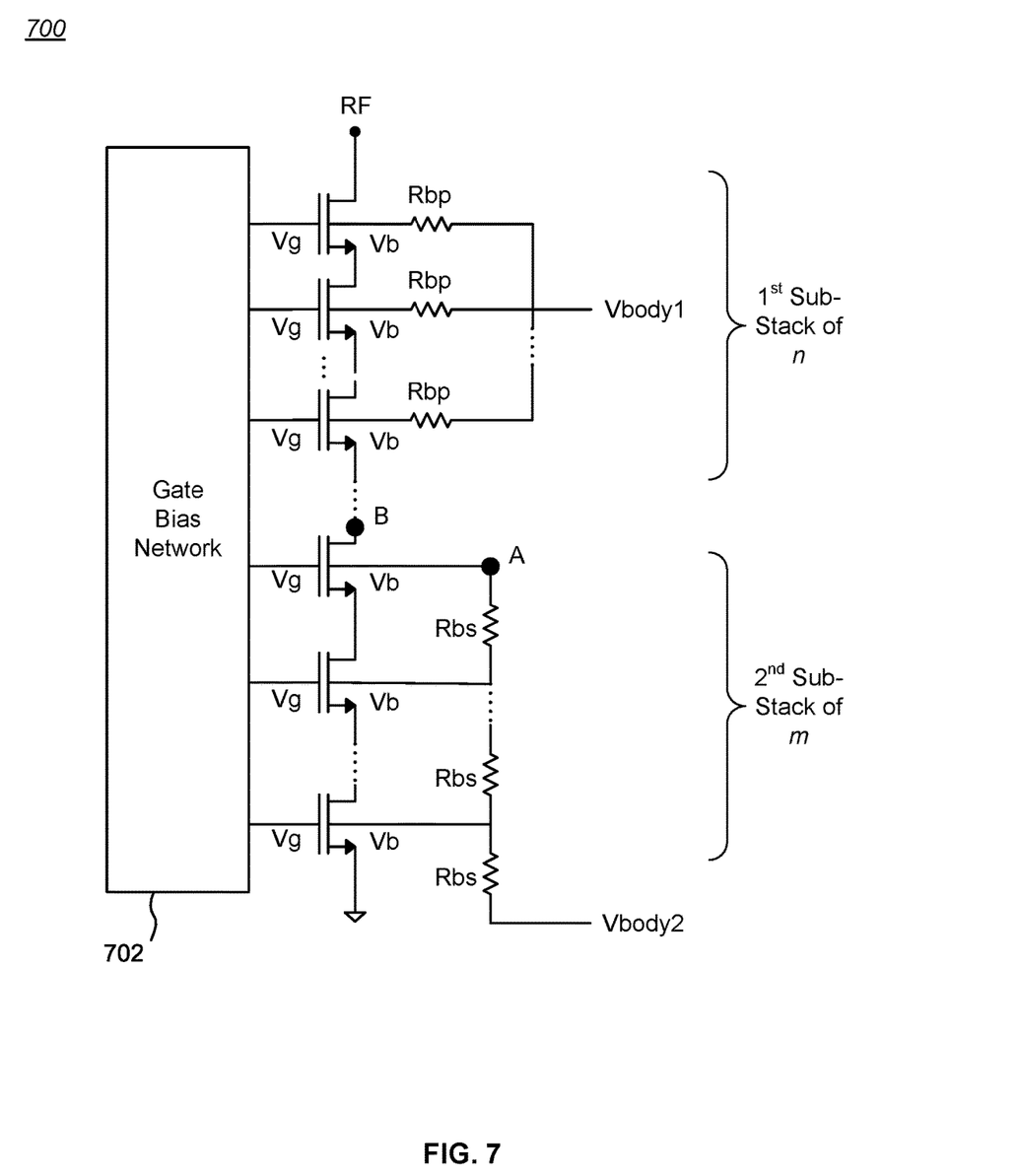
FIG. 7 is a schematic diagram of a non-ACS FET switch stack which includes two series-coupled sub-stacks and mixed-style body resistor bias networks.

As another case of embodiments that may beneficially utilize the invention, in FET switch stacks that do not use ACS FETs, similar mixed-type rung-rail bias networks may be useful for biasing the body of the non-ACS FETs. For example, FIG. 7 is a schematic diagram of a non-ACS FET switch stack 700 which includes two series-coupled sub-stacks and mixed-style body resistor bias networks. The individual FETs of the FET switch stack 700 are coupled to a desired gate bias network 702, which may be a rail or rung gate resistor bias network or a mixed rung-and-rail gate resistor bias network similar to the gate bias resistor networks described above with respect to ACS FETs. In the illustrated example, a first sub-stack of n FETs is configured with a rung body resistor bias network configuration comprising parallel body resistors Rbp coupled to a first control voltage Vbody1 and to the body of a corresponding one of the n FETs. A second sub-stack of m FETs is configured with a rail body resistor bias network configuration comprising series body resistors Rbs coupled to a second control voltage Vbody2 and to the respective body of at least two of the m ACS FETs (in generally, such FETs would be adjacent). Both n and m are integers, with n being at least one and m being greater than one, and may or may not be equal to each other. Note that such a configuration may include one or more end-cap $M_0$ FETs of the type shown in FIG. 6. The invention encompasses any combination of FET ordering as long as at least one rung and/or rail resistor separates each FET body from any other FET body in the stack and/or sub-stack configuration.

In this case, the leakage current of individual FETs is the same as that of ACS FETs. The leakage current is conducted through Rbp and Rbs, and causes a voltage offset between the body of the FETs (Vb) and the control voltage Vbody1 and Vbody2. In the case of non-ACS FETs, there is no leakage current conducted through the gate bias network, and thus the DC Vg of all of the FETs is the same. If we assume that Vg is equal to Vbody1 and/or Vbody2, the body voltage Vb of the FETs is different from Vg. That difference in voltage will degrade the linearity performance of the FETs. In FIG. 7, the Vb of the top FET of the $2^{nd}$ sub-stack of m FETs (at node A) has the largest voltage offset with respect to Vbody2 and Vg. It is desirable to keep this offset low (e.g., less than 1V for common MOSFETs), which can be accomplished with a mixed rung-and-rail body resistor bias network configured as described above.

As in the example of FIG. 5, when the switch stack is configured for usage as a series switch, it may be useful to configure the body resistor bias networks of the switch stack in a rung-rail-rung configuration. For example, a first sub-stack of n1 FETs would be configured with a rung body resistor bias network configuration comprising parallel body resistors Rbp coupled to a first control voltage Vbody1. A second sub-stack of m FETs would be configured with a rail body resistor bias network configuration comprising series body resistors Rbs coupled to a second control voltage Vbody2. A third sub-stack of n2 FETs would configured with a rung body resistor bias network configuration comprising parallel body resistors Rbp coupled to a third control voltage Vbody3. Note that such a configuration may include one or more end-cap $M_0$ FETs of the type shown in FIG. 6.

Referring again to FIG. 6, an option is to couple an AC Coupling Module 602 to at least one end of the $2^{nd}$ sub-stack of m FETs (i.e., the FETs coupled to the series rail gate bias resistors Rgs). The switch stack 600 may be configured to be coupled in a shunt configuration or in a series configuration. In a shunt configuration, the AC Coupling Module 602 would be coupled to the end of the $2^{nd}$ sub-stack closest to an applied RF input signal. In a series configuration, an AC Coupling Module 602 may be coupled to both ends of the $2^{nd}$ sub-stack.

In some embodiments, the AC Coupling Module 602 may comprise a DC blocking capacitor C1, while in other embodiments the AC Coupling Module 602 may comprise a DC blocking capacitor C1 connected in series with a resistor R1 (the order of connection of C1 and R1 does not matter). The AC Coupling Module 602 improves voltage division along the rail gate bias resistors and allows the gate of the FET of the $2^{nd}$ sub-stack of m FETs coupled to an applied RF input signal to more fully track the transistor common mode voltage during RF operation. By using one or more AC Coupling Modules 602 for the FETs coupled to the series rail gate bias resistors Rgs, the load seen by the FETs nearest the ends of the stack can be substantially mitigated or even totally eliminated.

Referring back to FIG. 7, if a series-connected body charge control resistor ladder 806 is included in the FET switch stack 700, one or more similar AC Coupling Modules 602 will provide the same load mitigation benefits for the body (or "back gate") of the FET of the $2^{nd}$ sub-stack of m FETs (i.e., the FETs coupled to the series rail body bias resistors Rbs) to which an RF input signal is applied (e.g., node B in FIG. 7).

AC Coupling Modules may be used for both series rail gate bias resistors Rgs and series rail body bias resistors Rbs independently of each other, or in conjunction with each other. In general, when using a series-connected gate bias resistor ladder and/or a series-connected body charge control resistor ladder, there are significant benefits to using an AC Coupling Module between the respective resistor ladders and any RF terminal presenting an RF load, in order to mitigate or even totally eliminate an RF load across the FET coupled to that RF terminal.

Inclusion of one or more AC Coupling Modules 602 should have essentially no adverse effect on the performance characteristics of the FET switch stacks 600, 700 (e.g., in terms of switching time constant, resistor power dissipation, resistive voltage drop through body resistors due to body current, etc.). On the other hand, the inclusion of one or more of AC Coupling Modules 602 substantially eliminates the reduction in the peak breakdown voltage (BV) withstand capability that would otherwise occur for the FET in the switch stack to which an RF input signal is applied. Additional details about the benefits and uses of an AC Coupling Gate Module 602 may be found in U.S. patent application Ser. No. 15/939,144, referenced above.

Uses

Circuits and devices in accordance with the present invention may be used alone or in combination with other components, circuits, and devices. Embodiments of the present invention may be fabricated as integrated circuits (ICs), which may be encased in IC packages and/or or modules for ease of handling, manufacture, and/or improved performance.

Circuits in accordance with the present invention are useful in a wide variety of larger radio frequency (RF) circuits for performing a range of functions. Such functions are useful in a variety of applications, such as radar systems (including phased array and automotive radar systems), radio systems, and test equipment. Such circuits may be useful in systems operating over some or all of the RF range (e.g., from around 20 kHz to about 300 GHz).

Radio system usage includes cellular radios systems (including base stations, relay stations, and hand-held transceivers) that use such technology standards as various types of orthogonal frequency-division multiplexing ("OFDM"), various types of quadrature amplitude modulation ("QAM"), Code Division Multiple Access ("CDMA"), Wide Band Code Division Multiple Access ("WCDMA"), Global System for Mobile Communications ("GSM"), Enhanced Data Rates for GSM Evolution (EDGE), Long Term Evolution ("LTE"), 5G New Radio ("5G NR"), as well as other radio communication standards and protocols.

In particular, the present invention is useful in portable battery-operated devices, such as cellular telephones, that would benefit from utilizing switches that exhibit low current leakage, thus enabling better battery life.

Methods

Figure 8:
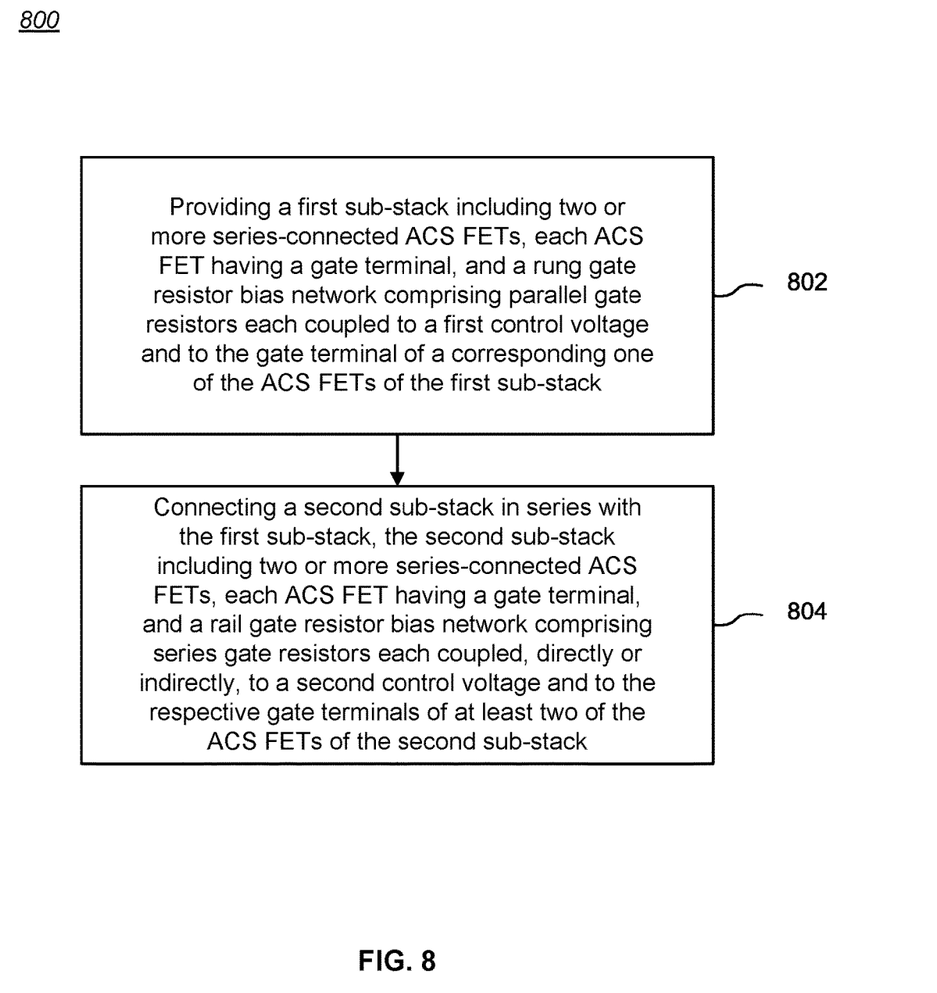
FIG. 8 is a process flow diagram showing a first method for configuring a FET switch stack.
Figure 9:
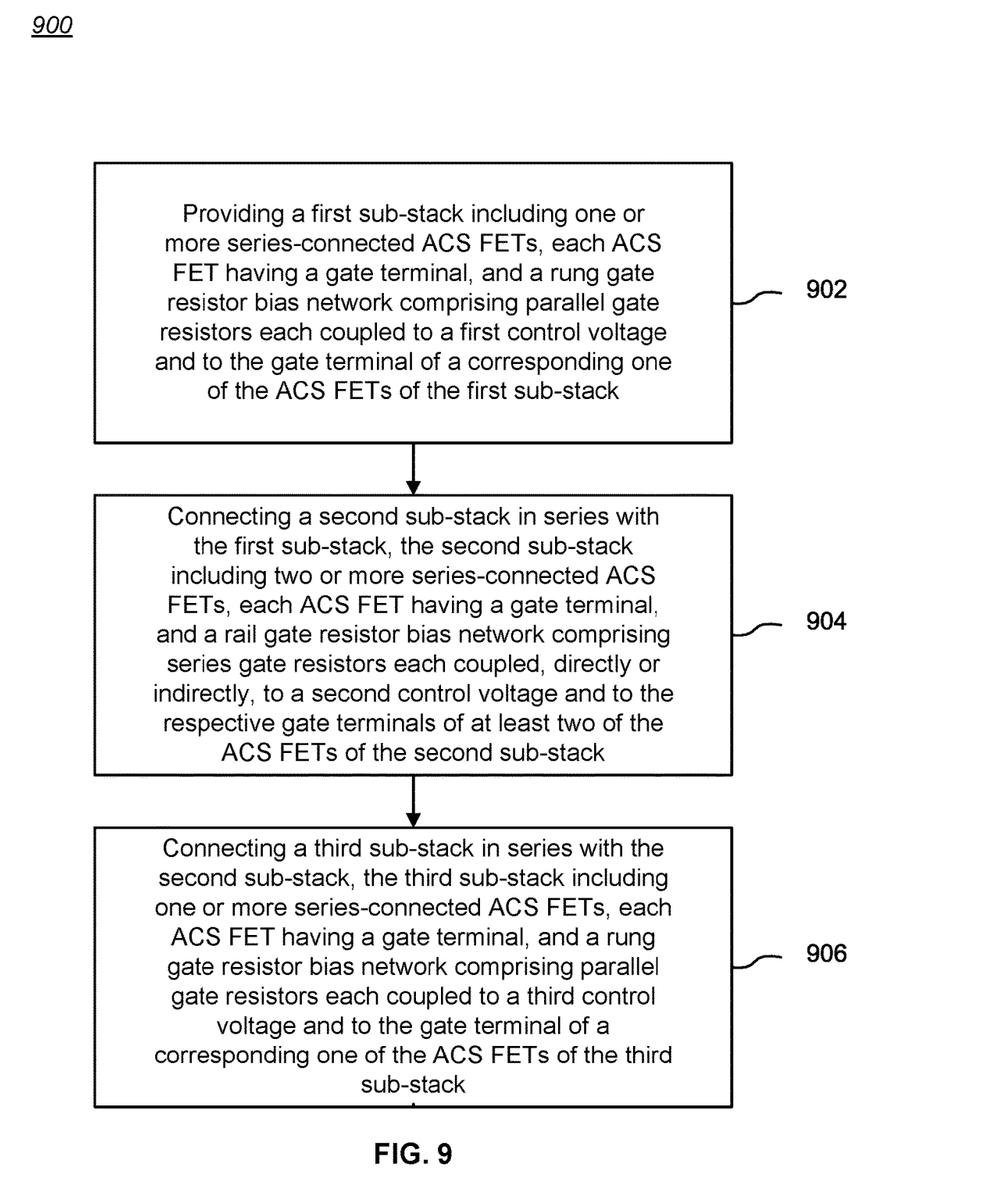
FIG. 9 is a process flow diagram showing a second method for configuring a FET switch stack.

Another aspect of the invention includes methods for configuring a FET switch stack. For example, FIG. 8 is a process flow diagram 800 showing a first method for configuring a FET switch stack. The method includes: providing a first sub-stack including one or more series-connected ACS FETs, each ACS FET having a gate terminal, and a rung gate resistor bias network comprising parallel gate resistors each coupled to a first control voltage and to the gate terminal of a corresponding one of the ACS FETs of the first sub-stack (Block 802); and connecting a second sub-stack in series with the first sub-stack, the second sub-stack including two or more series-connected ACS FETs, each ACS FET having a gate terminal, and a rail gate resistor bias network comprising series gate resistors each coupled, directly or indirectly, to a second control voltage and to the respective gate terminals of at least two of the ACS FETs of the second sub-stack (Block 804);

As another example, FIG. 9 is a process flow diagram 900 showing a second method for configuring a FET switch stack. The method includes: providing a first sub-stack including one or more series-connected ACS FETs, each ACS FET having a gate terminal, and a rung gate resistor bias network comprising parallel gate resistors each coupled to a first control voltage and to the gate terminal of a corresponding one of the ACS FETs of the first sub-stack (Block 902); connecting a second sub-stack in series with the first sub-stack, the second sub-stack including two or more series-connected ACS FETs, each ACS FET having a gate terminal, and a rail gate resistor bias network comprising series gate resistors each coupled, directly or indirectly, to a second control voltage and to the respective gate terminals of at least two of the ACS FETs of the second sub-stack (Block 904); and connecting a third sub-stack in series with the second sub-stack, the third sub-stack including one or more series-connected ACS FETs, each ACS FET having a gate terminal, and a rung gate resistor bias network comprising parallel gate resistors each coupled to a third control voltage and to the gate terminal of a corresponding one of the ACS FETs of the third sub-stack (Block 906).

Figure 10:
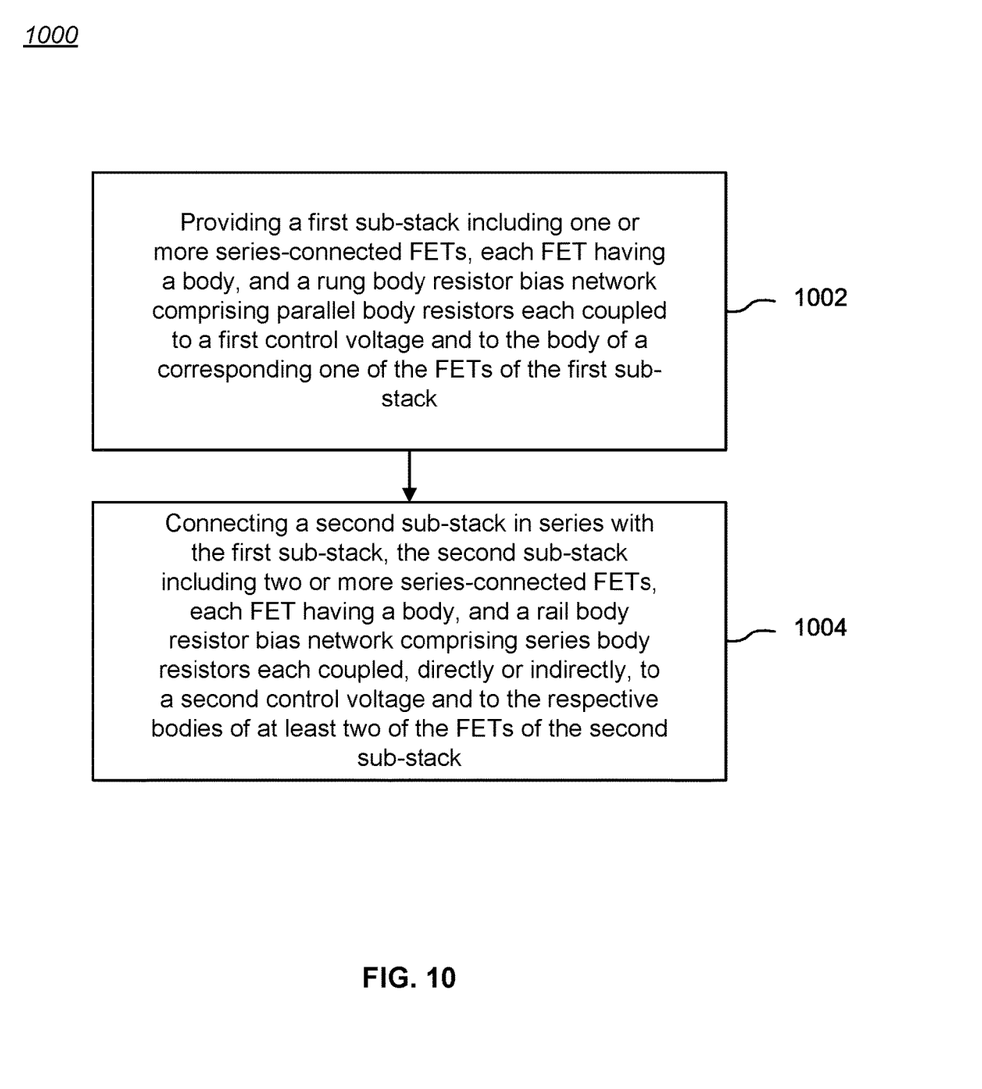
FIG. 10 is a process flow diagram showing a third method for configuring a FET switch stack.

As yet another example, FIG. 10 is a process flow diagram 1000 showing a third method for configuring a FET switch stack. The method includes: providing a first sub-stack including one or more series-connected FETs, each FET having a body, and a rung body resistor bias network comprising parallel body resistors each coupled to a first control voltage and to the body of a corresponding one of the FETs of the first sub-stack (Block 1002); and connecting a second sub-stack in series with the first sub-stack, the second sub-stack including two or more series-connected FETs, each FET having a body, and a rail body resistor bias network comprising series body resistors each coupled, directly or indirectly, to a second control voltage and to the respective bodies of at least two of the FETs of the second sub-stack (Block 1104).

Figure 11:
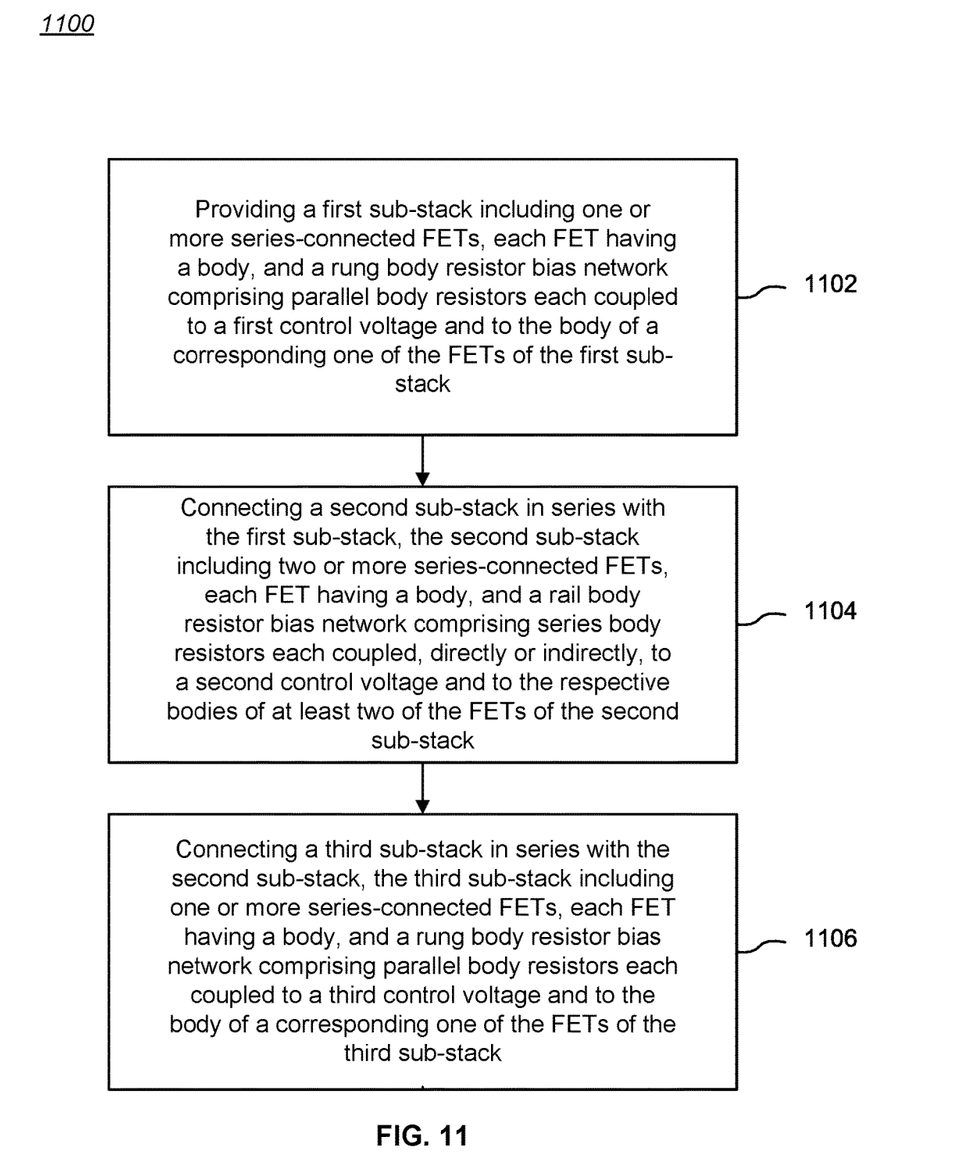
FIG. 11 is a process flow diagram showing a fourth method for configuring a FET switch stack.

As still another example, FIG. 11 is a process flow diagram 1100 showing a fourth method for configuring a FET switch stack. The method includes: providing a first sub-stack including one or more series-connected FETs, each FET having a body, and a rung body resistor bias network comprising parallel body resistors each coupled to a first control voltage and to the body of a corresponding one of the FETs of the first sub-stack (Block 1102); connecting a second sub-stack in series with the first sub-stack, the second sub-stack including two or more series-connected FETs, each FET having a body, and a rail body resistor bias network comprising series body resistors each coupled, directly or indirectly, to a second control voltage and to the respective bodies of at least two of the FETs of the second sub-stack (Block 1104); and connecting a third sub-stack in series with the second sub-stack, the third sub-stack including one or more series-connected FETs, each FET having a body, and a rung body resistor bias network comprising parallel body resistors each coupled to a third control voltage and to the body of a corresponding one of the FETs of the third sub-stack (Block 1106).

Additional aspects of the above methods may include one or more of the following: wherein at least one ACS FET of the FET switch stack is a positive-logic FET, the FET switch stack further including at least one end-cap FET of a type that turns OFF when the $V_{GS}$ of such end-cap FET is essentially zero volts; wherein each end-cap FET functions as a DC blocking capacitor when in an OFF state, and as a resistive signal path when in an ON state; wherein the series gate resistors have resistance values that are tapered from a first ACS FET of the second sub-stack to a last ACS FET of the second sub-stack; wherein the FETs of the first and second sub-stacks are placed in any physical ordering, so long as at least one parallel gate resistor and/or at least one series gate resistor separates the gate terminal of each FET from the gate terminal of any other FET; wherein the ACS FETs of the second sub-stack include two end ACS FETs, and the series gate resistors have resistance values that are tapered from the two end ACS FETs of the second sub-stack to a node between the two end ACS FETs of the second sub-stack; wherein the FETs of the first, second, and third sub-stacks are placed in any physical ordering, so long as at least one parallel gate resistor and/or at least one series gate resistor separates the gate terminal of each FET from the gate terminal of any other FET; wherein one or more of the FETs is an ACS FET; wherein the FETs of the first and second sub-stacks are placed in any physical ordering, so long as at least one parallel body resistor and/or at least one series body resistor separates the body of each FET from the body of any other FET; and/or wherein the FETs of the first, second, and third sub-stacks are placed in any physical ordering, so long as at least one parallel body resistor and/or at least one series body resistor separates the body of each FET from the body of any other FET.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components to withstand greater voltages as described above, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A FET switch stack, including:
   (a) a first sub-stack including:
      (1) one or more series-connected ACS FETs, each ACS FET having a gate terminal; and
      (2) a rung gate resistor bias network comprising gate resistors each coupled to a first control voltage and to the gate terminal of a corresponding one of the ACS FETs of the first sub-stack;
   (b) a second sub-stack, series connected to the first sub-stack, including:
      (1) two or more series-connected ACS FETs, each ACS FET having a gate terminal; and
      (2) a rail gate resistor bias network comprising series gate resistors each coupled, directly or indirectly, to a second control voltage and to the respective gate terminals of at least two of the ACS FETs of the second sub-stack.

2. The invention of claim 1, wherein at least one ACS FET of the FET switch stack is a positive-logic FET, the FET switch stack further including at least one end-cap FET of a type that turns OFF when the $V_{GS}$ of such end-cap FET is essentially zero volts.

3. The invention of claim 2, wherein each end-cap FET functions as a DC blocking capacitor when in an OFF state, and as a resistive signal path when in an ON state.

4. The invention of claim 1, wherein the series gate resistors have resistance values that are tapered from a first ACS FET of the second sub-stack to a last ACS FET of the second sub-stack.

5. The invention of claim 1, wherein the FETs of the first and second sub-stacks are placed in any physical ordering, so long as at least one parallel gate resistor and/or at least one series gate resistor separates the gate terminal of each FET from the gate terminal of any other FET.

6. A FET switch stack including:
   (a) a first sub-stack including:
      (1) one or more series-connected ACS FETs, each ACS FET having a gate terminal; and
      (2) a rung gate resistor bias network comprising gate resistors each coupled to a first control voltage and to the gate terminal of a corresponding one of the ACS FETs of the first sub-stack;
   (b) a second sub-stack, series connected to the first sub-stack, including:
      (1) two or more series-connected ACS FETs, each ACS FET having a gate terminal; and
      (2) a rail gate resistor bias network comprising series gate resistors each coupled, directly or indirectly, to a second control voltage and to the respective gate terminals of at least two of the ACS FETs of the second sub-stack; and
   (c) a third sub-stack, series connected to the second sub-stack, including:
      (1) one or more series-connected ACS FETs, each ACS FET having a gate terminal; and
      (2) a rung gate resistor bias network comprising gate resistors each coupled to a third control voltage and to the gate terminal of a corresponding one of the ACS FETs of the third sub-stack.

7. The invention of claim 6, wherein at least one ACS FET of the FET switch stack is a positive-logic FET, the FET switch stack further including at least one end-cap FET of a type that turns OFF when the $V_{GS}$ of such end-cap FET is essentially zero volts.

8. The invention of claim 7, wherein each end-cap FET functions as a DC blocking capacitor when in an OFF state, and as a resistive signal path when in an ON state.

9. The invention of claim 6, wherein the ACS FETs of the second sub-stack include two end ACS FETs, and the series gate resistors have resistance values that are tapered from the two end ACS FETs of the second sub-stack to a node between the two end ACS FETs of the second sub-stack.

10. The invention of claim 6, wherein the FETs of the first, second, and third sub-stacks are placed in any physical ordering, so long as at least one parallel gate resistor and/or at least one series gate resistor separates the gate terminal of each FET from the gate terminal of any other FET.

11. A FET switch stack, including:
    (a) a first sub-stack including:
       (1) one or more series-connected FETs, each FET having a body; and
       (2) a rung body resistor bias network comprising body resistors each coupled to a first control voltage and to the body of a corresponding one of the FETs of the first sub-stack;
    (b) a second sub-stack, series connected to the first sub-stack, including:
       (1) two or more series-connected FETs, each FET having a body; and
       (2) a rail body resistor bias network comprising series body resistors each coupled, directly or indirectly, to a second control voltage and to the respective bodies of at least two of the FETs of the second sub-stack.

12. The invention of claim 11, wherein one or more of the FETs is an ACS FET.

13. The invention of claim 11, wherein the FETs of the first and second sub-stacks are placed in any physical ordering, so long as at least one parallel body resistor and/or at least one series body resistor separates the body of each FET from the body of any other FET.

14. A FET switch stack, including:
    (a) a first sub-stack including:
       (1) one or more series-connected FETs, each FET having a body; and (2) a rung body resistor bias network comprising body resistors each coupled to a first control voltage and to the body of a corresponding one of the FETs of the first sub-stack;
(b) a second sub-stack, series connected to the first sub-stack, including:
  (1) two or more series-connected FETs, each FET having a body; and
  (2) a rail body resistor bias network comprising series body resistors each coupled, directly or indirectly, to a second control voltage and to the respective bodies of at least two of the FETs of the second sub-stack; and
(c) a third sub-stack, series connected to the second sub-stack, including:
  (1) one or more series-connected FETs, each FET having a body; and
  (2) a rung body resistor bias network comprising body resistors each coupled to a third control voltage and to the body of a corresponding one of the FETs of the third sub-stack.

15. The invention of claim 14, wherein one or more of the FETs is an ACS FET.

16. The invention of claim 14, wherein the FETs of the first, second, and third sub-stacks are placed in any physical ordering, so long as at least one parallel body resistor and/or at least one series body resistor separates the body of each FET from the body of any other FET.

* * * * *